(12) United States Patent
Cork

(10) Patent No.: US 7,984,395 B2
(45) Date of Patent: Jul. 19, 2011

(54) HIERARCHICAL COMPRESSION FOR METAL ONE LOGIC LAYER

(75) Inventor: Christopher M. Cork, Meylan (FR)

(73) Assignee: Synopsys, Inc., Mountain View, CA (US)

( * ) Notice: Subject to any disclaimer, the term of this patent is extended or adjusted under 35 U.S.C. 154(b) by 745 days.

(21) Appl. No.: 12/016,072

(22) Filed: Jan. 17, 2008

(65) Prior Publication Data

US 2009/0187871 A1  Jul. 23, 2009

(51) Int. Cl.
*G06F 17/50* (2006.01)
(52) U.S. Cl. ............................................. 716/55; 716/53
(58) Field of Classification Search ........................ None
See application file for complete search history.

(56) References Cited

U.S. PATENT DOCUMENTS

| | | | |
|---|---|---|---|
| 6,303,253 B1 * | 10/2001 | Lu | 430/5 |
| 6,470,489 B1 * | 10/2002 | Chang et al. | 716/21 |
| 6,807,663 B2 * | 10/2004 | Cote et al. | 716/21 |
| 6,989,602 B1 * | 1/2006 | Lytle | 257/773 |
| 7,236,396 B2 * | 6/2007 | Houston et al. | 365/185.07 |
| 7,346,885 B2 * | 3/2008 | Semmler | 716/19 |
| 7,496,862 B2 * | 2/2009 | Chang et al. | 716/1 |
| 7,698,676 B1 * | 4/2010 | Qian | 716/8 |
| 2005/0251771 A1 * | 11/2005 | Robles | 716/5 |
| 2009/0055793 A1 * | 2/2009 | Melzner | 716/14 |
| 2009/0134471 A1 * | 5/2009 | Chatterjee et al. | 257/383 |

OTHER PUBLICATIONS

Lucas et al., "Logic Design for Printability Using OPC Methods," IEEE Design & Test of Computers, Jan.-Feb. 2006, pp. 30-37.*

* cited by examiner

*Primary Examiner* — Leigh Marie Garbowski
(74) *Attorney, Agent, or Firm* — Bever, Hoffman & Harms, LLP; Jeanette S. Harms

(57) ABSTRACT

A method of increasing hierarchy compression of a metal 1 standard cell layout during optical proximity correction (OPC) is provided. This method can use a context determination defined from the outermost OPC correctable-edge boundaries of a metal 1 standard cell and not extending past outermost OPC correctable edge boundaries of adjacent metal 1 standard cells in other rows. The method can also include (or can alternatively include) adjusting the landing pads (resulting from metal 2 placement) to fit within the lines of the metal 1 standard cell layout. This adjusting can be performed by a place and route tool as part of a "clean-up" operation after metal 2 placement. The landing pads can be sized for single or double vias. A layout design for the metal 1 standard cell layout can be output based on using the context determination and/or adjusting the landing pads for hierarchy compression.

14 Claims, 5 Drawing Sheets

HIERARCHICAL COMPRESSION FOR METAL ONE LOGIC LAYER

BACKGROUND OF THE INVENTION

1. Field of the Invention

The present invention relates to techniques to increase hierarchical compression for the metal one layer of an integrated circuit during optical proximity correction (OPC).

2. Related Art

In designing an integrated circuit (IC), engineers typically rely upon computer simulation tools to help create a circuit schematic design consisting of circuits coupled together to perform certain complex functions. For application specific ICs (ASICs), these tools can use standard cells to implement the circuits. To actually fabricate this design on an IC layer of a wafer, the design can be translated into a physical representation or layout. Typically, to perform this translation, automated layout tools can be used to place and interconnect the standard cells.

Once the layout of the circuit has been created, the next step to manufacturing the IC is to transfer the layout onto an IC layer. Optical lithography can perform this transfer, i.e. the layout is first transferred onto a physical template (e.g. a mask) which is in turn used to optically project the layout onto the IC layer.

In transferring the layout to the physical template, a mask (e.g. a quartz plate coated with chrome) is generally created for each layer of the IC design. To create a mask, the data representing the layout design for that layer can be input into a device, such as an electron beam machine, which writes the IC layout pattern into the mask material. In less complicated and dense integrated circuits, each mask comprises the geometric shapes which represent the desired circuit pattern for its corresponding layer. In more complicated and dense circuits in which the size of the circuit features approach the optical limits of the lithography process, the masks may also comprise optical proximity correction (OPC) features.

Optical proximity correction (OPC) applies systematic changes to geometries of the layout to improve the printability of a wafer pattern. Specifically, as the size of integrated circuit features drops to 0.18μ and below, the features can become smaller than the wavelength of the light used to create such features, thereby creating lithographic distortions when printing the features onto the IC layer of the wafer. These lithographic distortions can represent significant impacts on device performance.

The OPC-corrected masks can then be used to optically project the layout onto the IC layer coated with photoresist material. For each layer of the design, a light is shone on the mask corresponding to that layer via a visible light source or an ultra-violet light source. This light passes through the clear regions of the mask, whose image exposes the underlying photoresist layer. The light is blocked by the opaque regions of the mask, thereby leaving that underlying portion of the photoresist layer unexposed. The exposed photoresist layer is then developed, typically, through chemical removal of the exposed/non-exposed regions of the photoresist layer. The end result is an IC layer exhibiting the desired pattern that defines the geometries, features, lines, and shapes of that layer. This process is then repeated for each IC layer of the design.

Chip layouts for ICs can be intrinsically repetitive. Identifying repeating structures with the same context determination can be used in reducing the volume of information in the layout that needs to be processed. The context determination refers to an ambit (i.e. a distance used by the optical model) and identifying differences in context within this ambit. For example, once a repeating structure (having the same context determination) is identified, determining how to process that structure need only be done once. In some layouts, repeating structures could be instantiated hundreds of thousands of times. Thus, identifying repeating structures can dramatically reduce processing time of a layout.

As described in U.S. Pat. No. 6,807,663, which is incorporated by reference in its entirety, representative repeating structures can be pre-processed for OPC, thereby taking advantage of the repetitions in the layout. Advantageously, by limiting OPC computation to representative repeating structures and instantiating other repeating structures, process speed can be significantly increased while simultaneously decreasing disk/memory requirements. Unfortunately, not all IC layers can take advantage of this pre-processing.

In particular, metal 1 (i.e. the first metal layer to be patterned in an IC) is typically the slowest IC layer to correct for OPC because the metal 1 layer does not leverage a standard cell layout. That is, slight variations in cell patterns (as determined by an OPC engine) as well as landing pad locations (as determined by a place and route tool) typically result in almost all cells as being identified as unique rather than repetitive. Therefore, metal 1 currently runs flat, i.e. without the advantages inherent for hierarchy. As a result, OPC corrections for standard cells of a metal 1 layout can be extremely time-consuming, thereby resulting in a major bottleneck for the latest technology nodes. Therefore, a need arises for metal 1 techniques that can more effectively leverage a standard cell layout.

SUMMARY OF THE INVENTION

A method of increasing hierarchy compression of a metal 1 standard cell layout during optical proximity correction (OPC) is provided. This method can advantageously use a context determination defined from the outermost OPC correctable-edge boundaries of a metal 1 cell and not extending past outermost OPC correctable edge boundaries of adjacent metal 1 cells in other rows. The context can be defined as polygons other than those defined by the cell under consideration, and that lie within a given distance from any polygons of the cell under consideration. This given distance, also called the ambit, is typically slightly larger than the ambit of the model used for OPC correction, i.e. the distance over which the resulting optical signal has a non-trivial value.

This context determination converts a complex two dimensional problem into a much simpler one dimensional problem. That is, the defined context determination allows an OPC engine to ignore the standard cells in other rows, which significantly increases the probability of finding sets of repeating standard cells.

In another embodiment, the method can also include (or can alternatively include) adjusting the landing pads (resulting from metal 2 placement) to fit within the lines of the metal 1 standard cell layout. This adjusting can be performed by a place and route tool as part of a "clean-up" operation after metal 2 placement. The landing pads can be sized for single or double vias. Adjusting the landing pads to fit within the metal 1 lines reduces the need to place additional metal 1, i.e. the original polygons of the metal 1 standard cell layout can remain unaltered, thereby significantly increasing the probability of finding sets of repeating standard cells.

A layout design for the metal 1 standard cell layout can be output based on using the context determination and/or adjusting the landing pads for hierarchy compression.

DETAILED DESCRIPTION OF THE FIGURES

Figure 1:
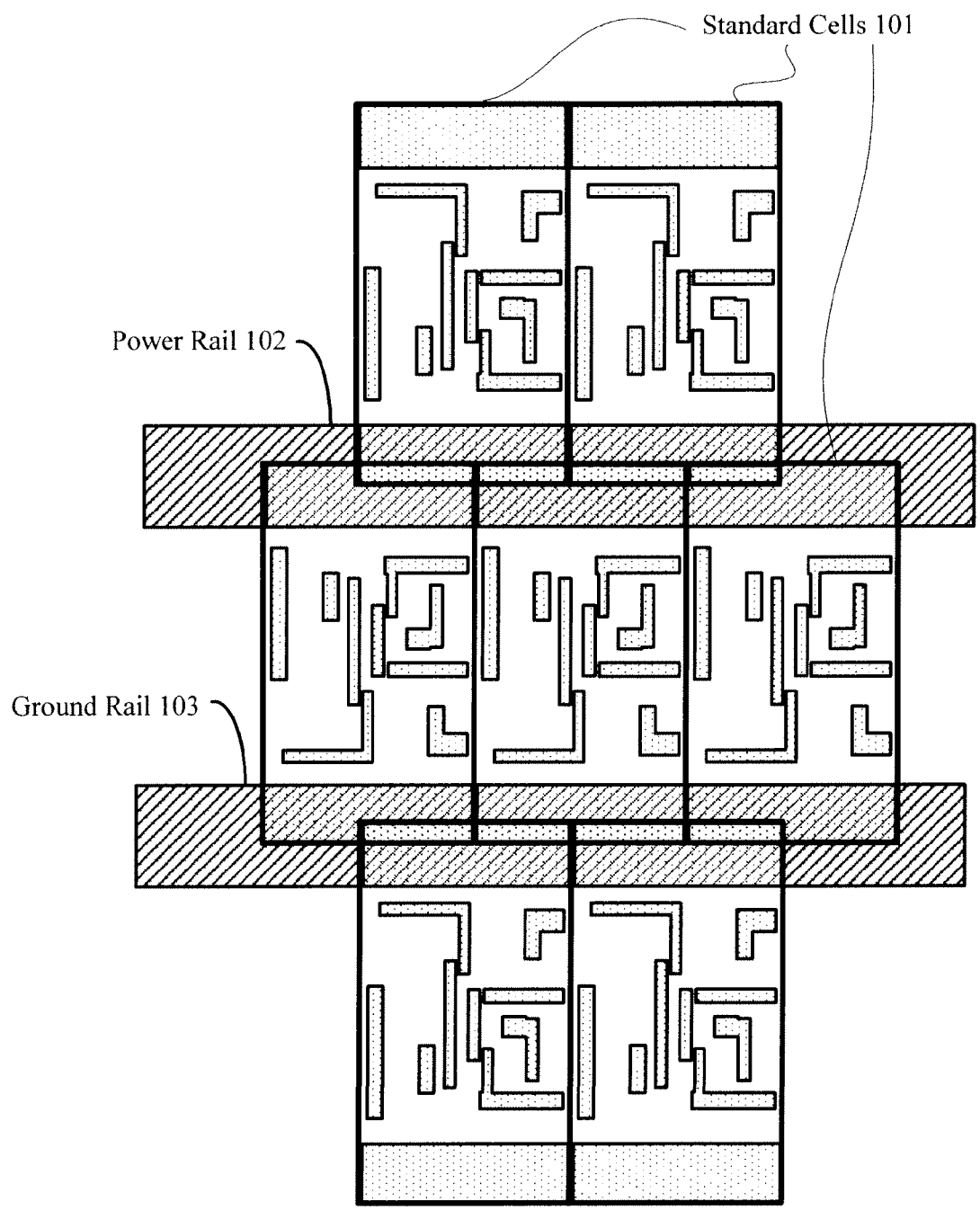
FIG. 1 illustrates how standard cell arrays are placed together in a layout.

FIG. 1 illustrates how standard cell arrays are placed together in a layout. Specifically, each standard cell 101 includes polygons that form straight lines, corners, T-junctions, etc. Each standard cell 101 has bands on top and bottom that when overlapped (or abutted to one another, which are not shown in FIG. 1) form a power rail 102 and a ground rail 103 for the layout. Note that FIG. 1 shows each standard cell 101 having the same polygons to emphasize the proper orientation of power rail 102/ground rail 103 with respect to those polygons. Specifically, the middle row of standard cells 101 is vertically flipped with respect to the top and bottom rows of standard cells to ensure the proper orientation of power rail 102/ground rail 103 to the polygons of standard cells 101. Each band in standard cell 101 is currently 660 nm wide, whereas the width of power rail 102 and ground rail 103 is 1.2 µm.

Notably, the metal 1 standard cell layout has significant potential for standard cell leveraging. For example, for many designs, almost half of the metal 1 design could be formed using filler standard cells, wherein a filler standard cell includes only the top and bottom bands that form the power and ground rails. This leads to significant repeatability in the left/right context of a cell if the neighbors are these filler cells and the width of the filler cell is greater than the context ambit. Of the remaining design, more than half of that remaining design could be formed using a few (e.g. 5-10) non-filler standard cells (i.e. standard cells including polygons in addition to the top/bottom bands) and almost all of that remaining design (e.g. 90%) could be formed using a relatively small number (e.g. 40-60) of non-filler standard cells. Because only a few standard cells are placed many times and most other cells are placed infrequently, using a correction template based on a standard cell and its neighboring two cells (to its right and left) can significantly leverage repeatability.

Figure 2:
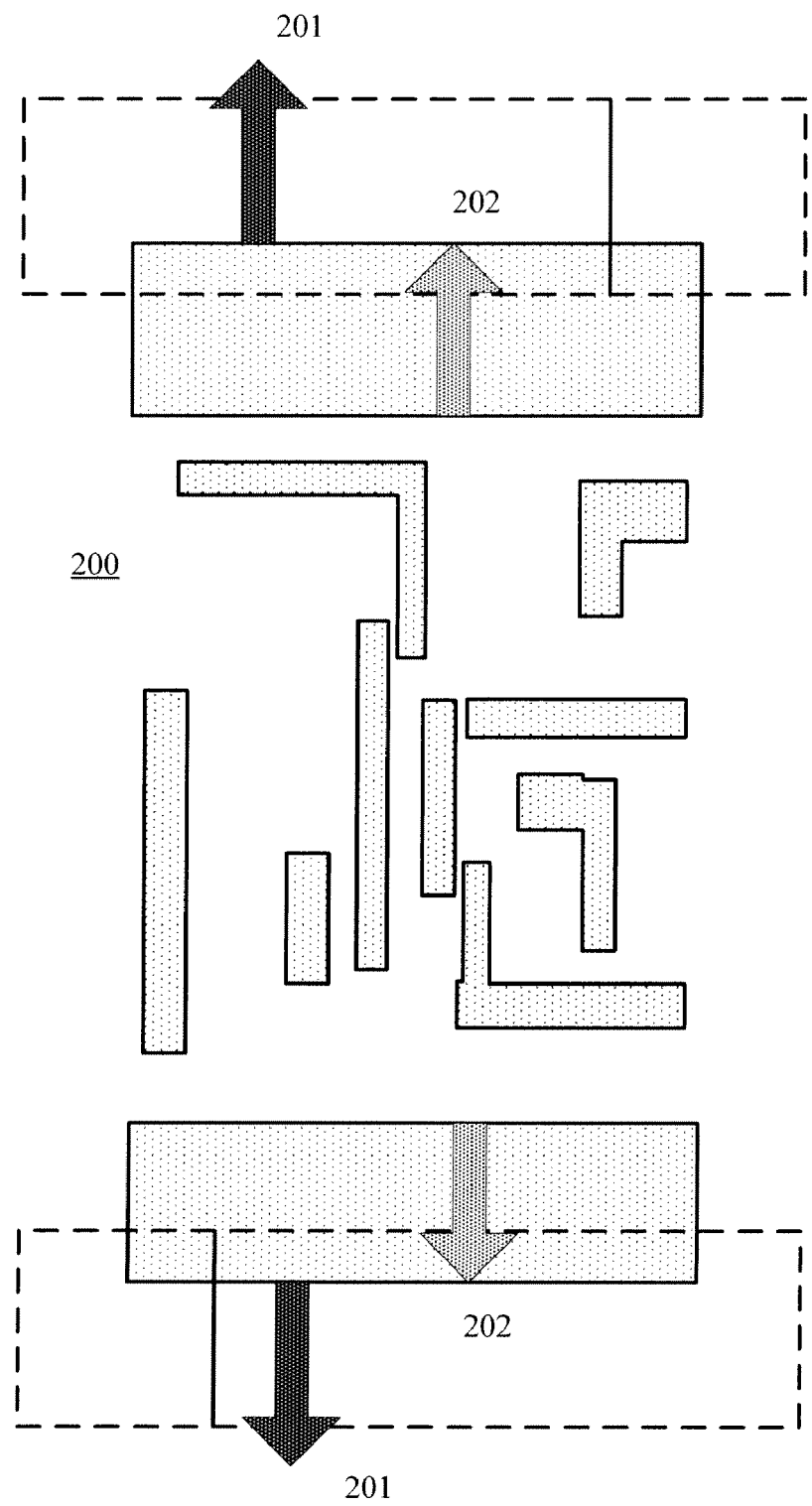
FIG. 2 illustrates a conventional context determination of a standard cell as well as a context determination in accordance with the present invention.

In accordance with one embodiment, the context determination (i.e. in an OPC analysis, a proximity context that determines a distance of interaction between a feature of interest and another feature) used by an OPC engine can be adjusted to increase the probability of being able to find a repetition of standard cells. For example, referring to FIG. 2, a conventional context determination of standard cell 200 is defined by arrows 201. That is, the conventional context determination begins at the outermost top and bottom boundaries of standard cell 2100 and extends out 1.0 µm (i.e. into the standard cells above and below standard cell 200, whose bands are shown for reference with dashed lines). Because left/right boundaries of standard cells in one row are offset from those of standard cells in another adjacent row, even extremely small differences in placement result in the OPC engine finding few if any duplicate standard cells in the design. In other words, by providing a context determination that can include features of standard cells in different rows, the problem of finding duplicate sets of standard cells becomes a two-dimensional problem. Thus, the context determination of 660 nm from the standard cell's outermost, uncorrectable edge significantly decreases the probability that duplicate sets of standard cells can be identified for compression.

In contrast, a context determination of standard cell 200 in accordance with one embodiment begins from the outermost correctable edges of standard cell 200, i.e. the innermost edges of the power/ground rails, as shown by arrows 202. Notably, the context determination can be advantageously adjusted to extend up to 1.2 µm (i.e. not into the adjacent standard cells above and below standard cell 200 in other rows). This context determination advantageously converts the complex, two-dimensional problem into a much more easily solved one-dimensional problem.

As indicated above, 5-10 standard cells can comprise over half of the design. Therefore, the probability of finding a significant number of standard cell sets (each standard cell set including at least 2 or 3 standard cells) in a row is quite high. Thus, the context determination of up to 1.2 µm from the standard cell's outermost, correctable edge significantly increases the probability that duplicate sets of standard cells can be identified for compression. In one embodiment for 65-90 nm designs, a context generator tool can use an context determination of approximately 1.0 µm.

Figure 3:
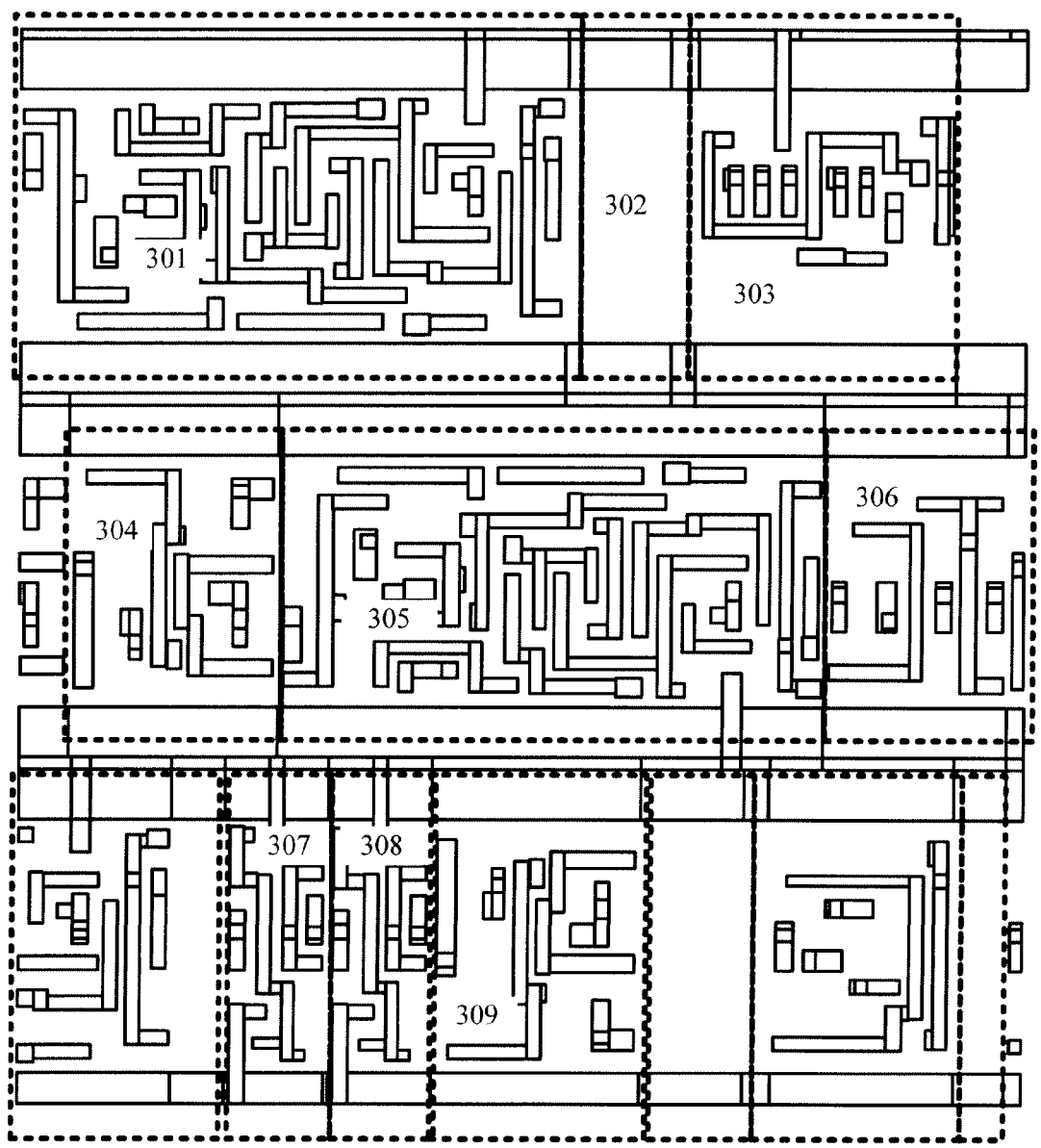
FIG. 3 illustrates an exemplary layout including three rows of standard cells.

FIG. 3 illustrates an exemplary layout 300 including three rows of standard cells. Assuming a context determination of up to 1.2 µm from the outermost correctable edge is defined by the OPC engine, it can begin searching for sets of repeatable standard cells. In one embodiment, a set of standard cells could include a filler standard cell, e.g. standard cells 301, 302, and 303 (wherein standard cells 301 and 303 are non-filler cells and standard cell 302 is a filler cell). A set of standard cells could also include only non-filler cells, e.g. standard cells 304, 305, and 306. A set of standard cells could also include duplicate individual standard cells, e.g. standard cells 307, 308, and 309 (of which cells 307 and 308 are duplicates). Note that the dotted boundaries of standard cells 301-309 are for designation only and not meant to delineate the cells' context determinations.

In one embodiment, to provide the desired context determination from the outermost correctable edge of the standard cell, the OPC engine can be programmed to ignore any overlapped edge in the layout. In another embodiment, the desired context determination can be provided by using Boolean operations to remove the context of overlapped edges, thereby leaving only slivers of the original bands. (Note that bands should be restored to their original width before OPC corrections are made on the standard cells.) Yet another technique can include identifying within each cell which edges are overlapped by drawing an extra layer (for example, ground and power rails could be in a different data type within each standard cell). In yet another technique, the standard cells can be named and treated with different context determinations in the horizontal and vertical directions.

In accordance with another embodiment, the landing pads formed from metal 1 can be adjusted to minimize variability between standard cells. Specifically, a metal 2 layer is typically used to make connections between the standard cells by contacting to metal 1 pre-drawn polygons in the standard cell representing "pins". To make these connections, vias are formed vertically from the metal 2 layer to landing pads on the metal 1 standard cell layout. The locations of these landing pads on the metal 1 standard cell layout are called the "pins" of the standard cell. In a recent development based on design for manufacturing, double vias (i.e. doubling the number of vias for a given electrical connection) can be used to increase the probability of making contact with landing pads on metal 1.

Notably, conventional place and route tools may connect metal 2 lines to different metal 1 lines (or different locations within the same metal 1 lines) in identical standard cells. Unfortunately, as described below, even slight variability in landing pad placement for otherwise identical standard cells undesirably increases the number of unique standard cells identified by the OPC engine.

To decrease the number of unique standard cells, i.e. leverage hierarchy, the place and route tool could perform an additional "clean-up" operation that determines an optimized placement of landing pads for the standard cells. This optimized placement provides that the landing pads minimize the amount of additional metal 1 to be used. Specifically, the optimized placement can place the landing pads within the metal 1 lines.

Figure 4:
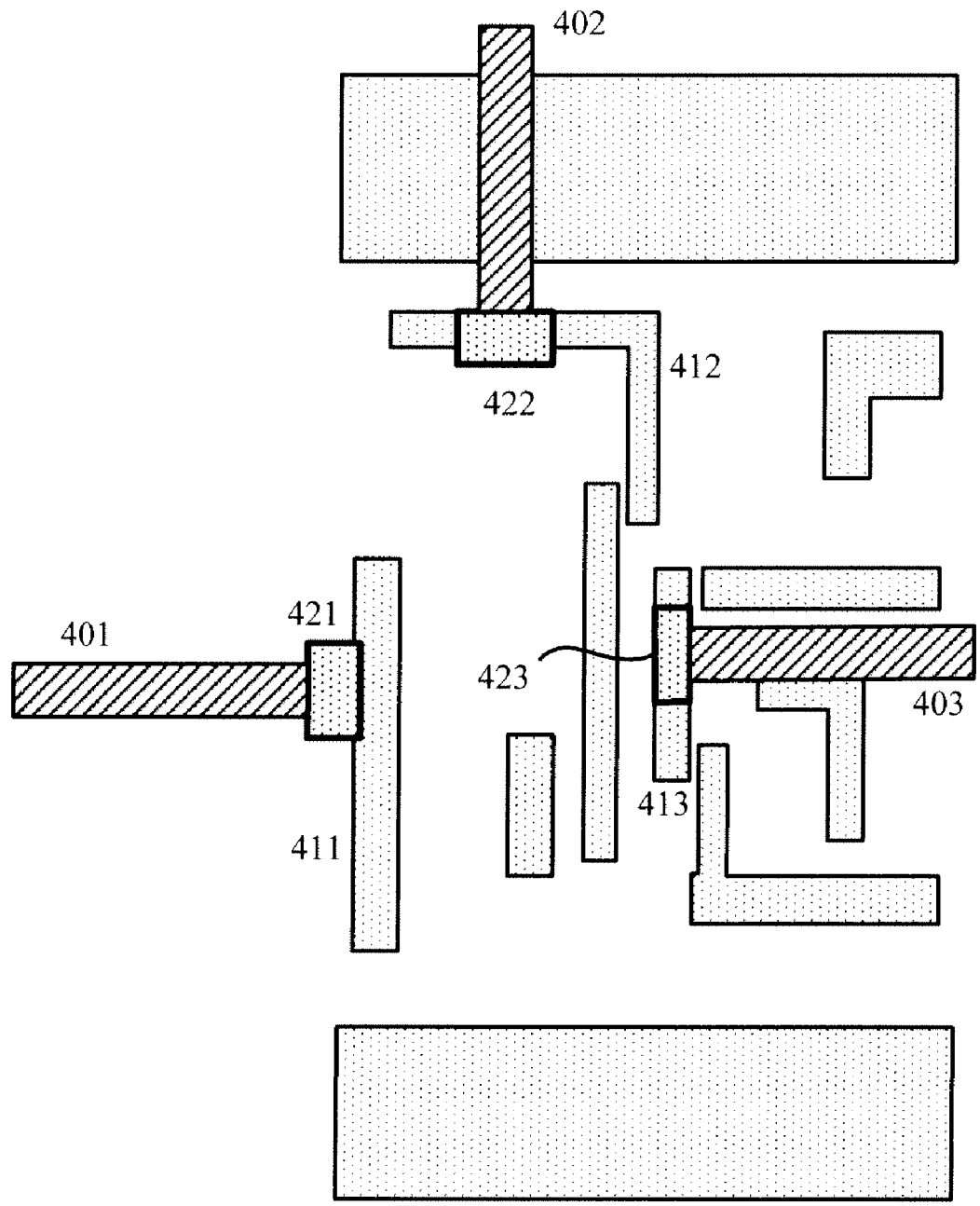
FIG. 4 illustrates exemplary positions of landing pads with respect to metal 1 lines and metal 2 lines.

For example, FIG. 4 illustrates the position of metal 2 lines 401, 402, and 403 as well as metal 1 lines 411, 412, and 413, which are to be connected to those metal 2 lines using landing pads 421, 422, and 423, respectively. In this embodiment, the drawn metal 1 polygon of the standard cell representing the connecting pin can be drawn wide or in such a way as to allow landing pads consistent with double vias to be totally enclosed.

In FIG. 4, each of landing pads 421, 422, and 423 has a different placement relative to its corresponding metal 1 line 411, 412, and 413. For example, landing pad 421 is placed to barely overlap its corresponding metal 1 line 411. In contrast, landing pad 422 is placed to completely overlap its corresponding metal 1 line 412, but also extends outside the boundaries of metal 1 line 412. Each of these landing pad placements results in additional metal 1 (i.e. in addition to that needed to form the polygons of the metal 1 standard cell layout) to connect the metal 2 lines to the metal 1 lines. Note that because the placement of metal 2 lines is substantially random, the location of the landing pads can vary significantly between identical standard cells. Therefore, additional metal 1 undesirably increases the probability that otherwise identical standard cells are identified by the OPC engine as being unique.

Therefore, to increase hierarchy leveraging, after placement of the metal 2 lines and the landing pads for the metal 1 standard cell layout, the place and route tool can determine an optimized placement for all landing pads within each standard cell. Landing pad 423 is an exemplary optimized placed landing pad with respect to metal 1 line 413. That is, the footprint of landing pad 423 is placed within the boundaries for metal line 413, thereby minimizing additional metal 1 and increasing the probability that the OPC engine can identify duplicate standard cells.

In one embodiment, to provide the in-boundary placement, the place and route tool can be operated off-grid, i.e. without respect to the grid pattern (e.g. 120 nm pitch) used to provide the original metal 2 placement. Note that if a landing pad must have a width greater than the width of a metal 1 line, then the width of the metal 1 line can be increased to accommodate the landing pad within its boundary. Alternatively, the landing pad can be moved so as to lie at the same position within the standard cell.

By ensuring that the OPC tool addresses a one dimensional problem and adjusting landing pad placements of the place and route tool, dramatic increases in compression can be achieved. The probability of increasing hierarchy compression (in this case by identifying 3 standard cells (which could be characterized as a standard cell set) in a row) can be expressed by the following equation based on Poisson statistics:

$$\text{Speed\_up} = 1/(1 - e^{-\lambda}\lambda)$$

where $\lambda = N/M^3$, M is the number of standard cells in a library and N is the number of standard cells in a design. Thus, for example, assuming that 50 unique standard cells are identified, each standard cell with an equal likelihood of being placed, and assuming 10 million standard cell placements in the design, a speed up of ×100 is expected. Thus, instead of taking approximately one month of computing time to process the OPC correction, the tools using the above-described techniques can dramatically reduce this computing time to approximately 8 hours.

Note that in actual practice, each standard cell can have a different probability of being placed. However, in typical designs, it appears that certain standard cells (e.g. up to 50 standard cells) will significantly outnumber other standard cells. As a result, the compression provided by matching these "dominant" standard cells into 3 in a row will provide at least the compression given by Poisson statistics. If these arrangements can be preferred by the place and route tool, then further hierarchical compression can be achieved.

Figure 5:
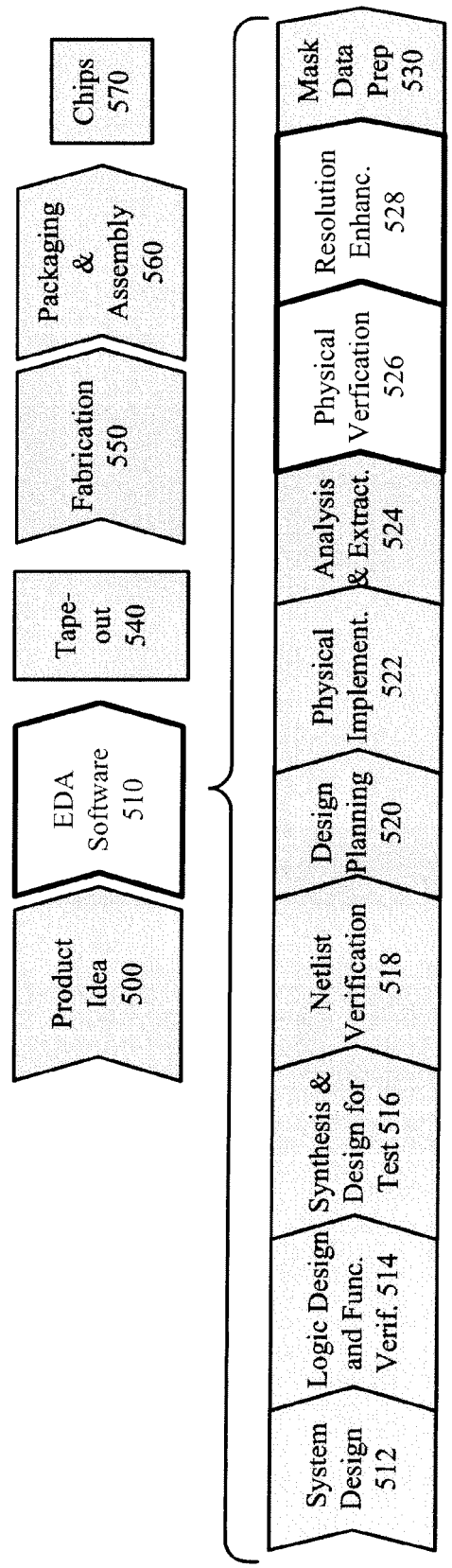
FIG. 5 illustrates a simplified representation of an exemplary digital ASIC design flow, which includes techniques that improve the hierarchy compression of the metal 1 standard cell layout.

FIG. 5 illustrates a simplified representation of an exemplary digital ASIC design flow, which includes the above-described techniques that improve the hierarchy compression of the metal 1 standard cell layout. At a high level, the process starts with the product idea (step 500) and is realized in an EDA software design process (step 510). When the design is finalized, it can be taped-out (event 540). After tape out, the fabrication process (step 550) and packaging and assembly processes (step 560) occur resulting, ultimately, in finished chips (result 570).

The EDA software design process (step 510) is actually composed of a number of steps 512-530, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components steps of the EDA software design process (step 510) follows.

In system design (step 512), the designers can describe the functionality that they want to implement, perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

In logic design and functional verification (step 514), the VHDL or Verilog code for modules in the system is written and the design is checked for functional accuracy. More specifically, the design is checked to ensure that the design produces the correct outputs. Exemplary EDA software products from Synopsys, Inc. that can be used at this step include VCS, VERA, DesignWare®, Magellan, Formality, ESP, and LEDA products.

In synthesis and design for test (step 516), the VHDL/Verilog code is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

In netlist verification (step 518), the netlist can be checked for compliance with timing constraints and for correspondence with the VHDL/Verilog code. Exemplary EDA software products from Synopsys, Inc. that can be used at this step include Formality, PrimeTime, and VCS products.

In design planning (step 520), an overall floorplan for the chip can be constructed and analyzed for timing and top-level routing. Exemplary EDA software products from Synopsys, Inc. that can be used at this step include Astro and IC Compiler products.

In physical implementation (step 522), the placement (positioning of circuit elements) and routing (connection of the same) can occur. Exemplary EDA software products from Synopsys, Inc. that can be used at this step include the Astro and IC Compiler products.

In analysis and extraction (step 524), the circuit function can be verified at a transistor level, which in turn permits what-if refinement. Exemplary EDA software products from Synopsys, Inc. that can be used at this step include AstroRail, PrimeRail, Primetime, and Star RC/XT products.

In physical verification (step 526), various checking functions can be performed to ensure correctness for manufacturing, electrical issues, lithographic issues, and circuitry. Exemplary EDA software products from Synopsys, Inc. that can be used at this step include the Hercules product. In one embodiment, the above-described landing pad adjustment can be performed by a place and route tool in this step.

In resolution enhancement (step 528), geometric manipulations of the layout to improve manufacturability of the design can be performed. Exemplary EDA software products from Synopsys, Inc. that can be used at this step include Proteus, ProteusAF, and PSMGen products. In one embodiment, the above-described context determination as measured from the outermost correctable edge of the standard cells can be defined and used by tools in this step.

In mask data preparation (step 530), the "tape-out" data for production of masks for lithographic use to produce finished chips can be generated. Exemplary EDA software products from Synopsys, Inc. that can be used at this step include the CATS® family of products.

The tools of FIG. 5 can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of microcontrollers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments have been described in detail herein with reference to the accompanying figures, it is to be understood that the invention is not limited to those precise embodiments. They are not intended to be exhaustive or to limit the invention to the precise forms disclosed.

For example, although a value of 1.2 µm is discussed herein as being a maximum value for the context determination, other embodiments could use a rough density value for distances greater than the 1.28 µm. In this manner, the context generator can still increase the number of repetitive standard cells (and standard cell sets) while still factoring in an average feature density for cells in rows above and below the cell being analyzed. Thus, although the problem as seen by the OPC tool remains one-dimensional, the context determination could include rough estimates obtained from rudimentary two-dimensional analysis.

Note also that although a place and route tool could be used to adjust the landing pads to fit within the boundaries defined for the metal 1 polygons, a post-processing script could also perform this function. Note that this post-processing could be done in tools with access to both the netlist and graphic data system (GDS) information (e.g. Synopsys tools such as Hercules™ or iC Compiler™).

Yet further note that although the above techniques can be used during OPC, such techniques can also be used during any mask synthesis operation involving hierarchical data and an ambit (e.g. assist feature placement, inverse lithography, and double patterning). Accordingly, it is intended that the scope of the invention be defined by the following Claims and their equivalents.

The invention claimed is:

1. A computer-readable non-transient medium embodying instructions that when executed by a processor increases hierarchy compression of a metal 1 standard cell layout during optical proximity correction (OPC), the instructions performing steps including:
   determining a context determination defined from outermost OPC correctable-edge boundaries of a metal 1 cell in a row and not extending past outermost OPC correctable edge boundaries of adjacent metal 1 cells in other rows;
   adjusting landing pads to fit within lines of the metal 1 standard cell layout; and
   outputting a layout design for the metal 1 standard cell layout based on using the context determination and adjusting the landing pads for hierarchy compression.

2. The computer-readable non-transient medium of claim 1, wherein determining the context determination includes ignoring overlapped edges of the metal 1 cell and the adjacent metal 1 cells.

3. A computer-readable non-transient medium embodying instructions that when executed by a processor increases hierarchy compression of a metal 1 standard cell layout during optical proximity correction (OPC), the instructions performing steps including:
   determining a context determination defined from outermost OPC correctable-edge boundaries of a metal 1 cell in a row and not extending past outermost OPC correctable edge boundaries of adjacent metal 1 cells in other rows; and
   outputting a layout design for the metal 1 standard cell layout based on using the context determination for hierarchy compression.

4. The computer-readable non-transient medium of claim 3, wherein determining the context determination includes ignoring overlapped edges of the metal 1 cell and the adjacent metal 1 cells.

5. A computer-readable non-transient medium embodying instructions that when executed by a processor increases hierarchy compression of a metal 1 standard cell layout during optical proximity correction (OPC), the instructions performing steps including:
   adjusting landing pads to fit within lines of the metal 1 standard cell layout; and
   outputting a layout design for the metal 1 standard cell layout based on adjusting the landing pads for hierarchy compression.

6. A method of increasing hierarchy compression of a metal 1 standard cell layout during optical proximity correction (OPC), the method including:
   using a computer, determining context determination defined from outermost OPC correctable-edge boundaries of a metal 1 cell in a row and not extending past outermost OPC correctable edge boundaries of adjacent metal 1 cells in other rows;
   adjusting landing pads to fit within lines of the metal 1 standard cell layout; and
   outputting a layout design for the metal 1 standard cell layout based on using the context determination and adjusting the landing pads for hierarchy compression.

7. The method of claim 6, wherein determining the context determination includes ignoring overlapped edges of the metal 1 cell and the adjacent metal 1 cells.

8. A method of increasing hierarchy compression of a metal 1 standard cell layout during optical proximity correction (OPC), the method including:
   using a computer, determining context determination defined from outermost OPC correctable-edge boundaries of a metal 1 cell in a row and not extending past outermost OPC correctable edge boundaries of adjacent metal 1 cells in other rows; and
   outputting a layout design for the metal 1 standard cell layout based on using the context determination for hierarchy compression.

9. The method of claim 8, wherein determining the context determination includes ignoring overlapped edges of the metal 1 cell and the adjacent metal 1 cells.

10. A method of increasing hierarchy compression of a metal 1 standard cell layout, the method including:
    using a computer, adjusting landing pads to fit within lines of the metal 1 standard cell layout; and
    outputting a layout design for the metal 1 standard cell layout based on adjusting the landing pads for hierarchy compression.

11. An optical proximity correction (OPC) engine including means for receiving data and instructions from a computer-readable storage non-transient medium, the computer-readable storage non-transient medium storing instructions that when executed by a processor increases hierarchy compression of a metal 1 standard cell layout, the instructions performing steps including:
    using the processor, determining context determination defined from outermost OPC correctable-edge boundaries of a metal 1 cell in a row and not extending past outermost OPC correctable edge boundaries of adjacent metal 1 cells in other rows; and
    outputting a layout design for the metal 1 standard cell layout based on using the context determination for hierarchy compression.

12. The OPC engine of claim 11, wherein determining the context determination includes ignoring overlapped edges of the metal 1 cell and the adjacent metal 1 cells.

13. A place and route tool including means for receiving data and instructions from a computer-readable storage non-transient medium, the computer-readable storage medium storing instructions that when executed by a processor increases hierarchy compression of a metal 1 standard cell layout, the instructions performing steps including:
    using the processor, adjusting landing pads to fit within lines of the metal 1 standard cell layout; and
    outputting a layout design for the metal 1 standard cell layout based on adjusting the landing pads for hierarchy compression.

14. A tool set including means for receiving data and instructions from a computer-readable storage non-transient medium, the computer-readable storage medium storing instructions that when executed by a processor increases hierarchy compression of a metal 1 standard cell layout, the instructions performing steps including:
    using the processor, determining context determination defined from outermost OPC correctable-edge boundaries of a metal 1 cell in a row and not extending past outermost OPC correctable edge boundaries of adjacent metal 1 cells in other rows;
    adjusting landing pads to fit within lines of the metal 1 standard cell layout; and
    outputting a layout design for the metal 1 standard cell layout based on using the context determination and adjusting the landing pads for hierarchy compression.

* * * * *

UNITED STATES PATENT AND TRADEMARK OFFICE
CERTIFICATE OF CORRECTION

| | | |
|---|---|---|
| PATENT NO. | : 7,984,395 B2 | Page 1 of 1 |
| APPLICATION NO. | : 12/016072 | |
| DATED | : July 19, 2011 | |
| INVENTOR(S) | : Christopher M. Cork | |

It is certified that error appears in the above-identified patent and that said Letters Patent is hereby corrected as shown below:

Column 3
Line 62, amend "2100" to --200--.

Signed and Sealed this
Fourth Day of September, 2012

David J. Kappos
*Director of the United States Patent and Trademark Office*